Nov. 17, 1959 R. M. POWELL 2,913,716

HIGH FREQUENCY OSCILLATOR FOR PROXIMITY FUZE

Filed May 6, 1952

INVENTOR
ROBERT M. POWELL

BY

G. D. O'Brien
R. M. Hicks
ATTORNEYS

United States Patent Office 2,913,716

Patented Nov. 17, 1959

2,913,716

HIGH FREQUENCY OSCILLATOR FOR PROXIMITY FUZE

Robert M. Powell, Hyattsville, Md., assignor to the United States of America as represented by the Secretary of the Navy Application May 6, 1952, Serial No. 286,413

1 Claim. (Cl. 343—7)

(Granted under Title 35, U.S. Code (1952), sec. 266)

The invention described herein may be manufactured and used by or for the Government of the United States of America for governmental purposes without the payment of any royalties thereon or therefor.

This invention relates to high frequency oscillating detector circuits and more particularly to a low frequency feed back system for improving the quality of the output of a high frequency detecting oscillator.

Oscillating detectors of the type involved in the present invention are used in transmitting and receiving systems, particularly those systems which involve the detection of moving targets. The present invention is adapted to be used in conjunction with fuze systems in which a transmitting and detecting oscillator emits a high frequency signal which is reflected from a moving target and detected by the oscillator circuit. The detected signal is then amplified to supply a triggering voltage for firing a projectile at a predetermined time to destroy the target. In installations of this type, it is necessary that noise in the detecting and amplifying means be reduced to a minimum to avoid false triggering and to render the firing circuit sensitive only to the desired signal.

In the past, attempts have been made to reduce noise by improving the characteristics of the amplifying means. However, a great deal of the noise produced in the receiving means is inherent in the detecting oscillator, so that it is highly desirable that the noise level of the oscillator itself be reduced before amplification of the detected signal. Considerable progress has been made in reducing the noise output of these oscillating tubes by careful design, rigid inspection, and by improvement of the components of the oscillator circuit and its associated power supply. These improvements have been achieved only by greatly increasing the cost of production of the oscillator and its associated circuitry. The present invention deals with a means for reducing oscillator noise by means of a feedback circuit which reduces considerably the noise level output and improves the quality of the output signal. The feedback circuit may be designed to attenuate all frequencies above the maximum frequency of the desired signal or may be designed to discriminate against all frequencies outside of a given band.

Accordingly, it is an object of the present invention to reduce undesirable high frequency audio signals such as the microphonic noise output of a detecting oscillator.

Another object of the invention is to reduce the effect of plate voltage supply noise and filament noise of a detecting oscillator by means of a negative feedback system.

A further object is to improve the linearity and the quality of the output signal of a grid modulated oscillator.

A still further object is to achieve a shaped audio response output from a detecting and transmitting oscillator by means of a frequency discriminating feedback system which attenuates noise outside a desired frequency.

Another object of the invention is to increase the gain of an oscillator when used as a detector by means of a positive feedback circuit.

Other objects and many of the attendant advantages of this invention will be readily appreciated as the same becomes better understood by reference to the following detailed descriptions when considered in connection with the accompanying drawings wherein.

Figure 1:
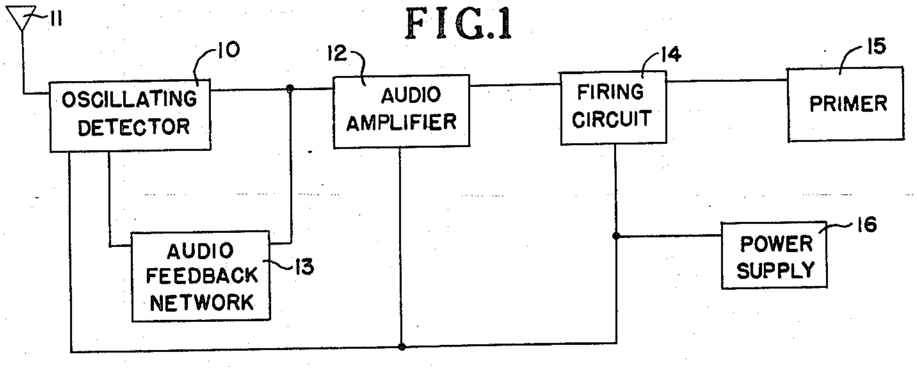
Fig. 1 is a block diagram showing one embodiment of the transmitting and receiving system for firing a fuze.

Referring now to the drawings, wherein like reference characters designate like or corresponding parts throughout the several views, there is shown in Fig. 1 (which illustrates a preferred embodiment) an oscillating detector 10 for producing a high frequency signal which is transmitted by an antenna 11. The transmitted signal is reflected from a moving target and the reflected signal received by the antenna 11 and fed to the oscillating detector 10. The frequency of the reflected signal will be somewhat different than that of the transmitted signal due to the Doppler effect of the moving target, and this frequency difference causes the impedance of the plate load circuit of the oscillator to vary at a low frequency rate corresponding to the frequency difference. The high frequency and audio signals present are separated in the oscillating detector circuit and the audio or low frequency signals are fed to an amplifier 12. A portion of these audio signals is returned to the oscillating detector circuit through an audio feedback network 13 to either aid or oppose the low frequency voltages appearing at the grid of the oscillating detector.

The output of the audio amplifier 12 is fed to a firing circuit 14 which controls a primer 15 to fire the missile when the correct Doppler signal is received by the antenna 11. A power supply 16 supplies operating voltages for the oscillating detector, the audio amplifier 12 and the firing circuit 14.

Figures 2, 3, 4, 5, 6:
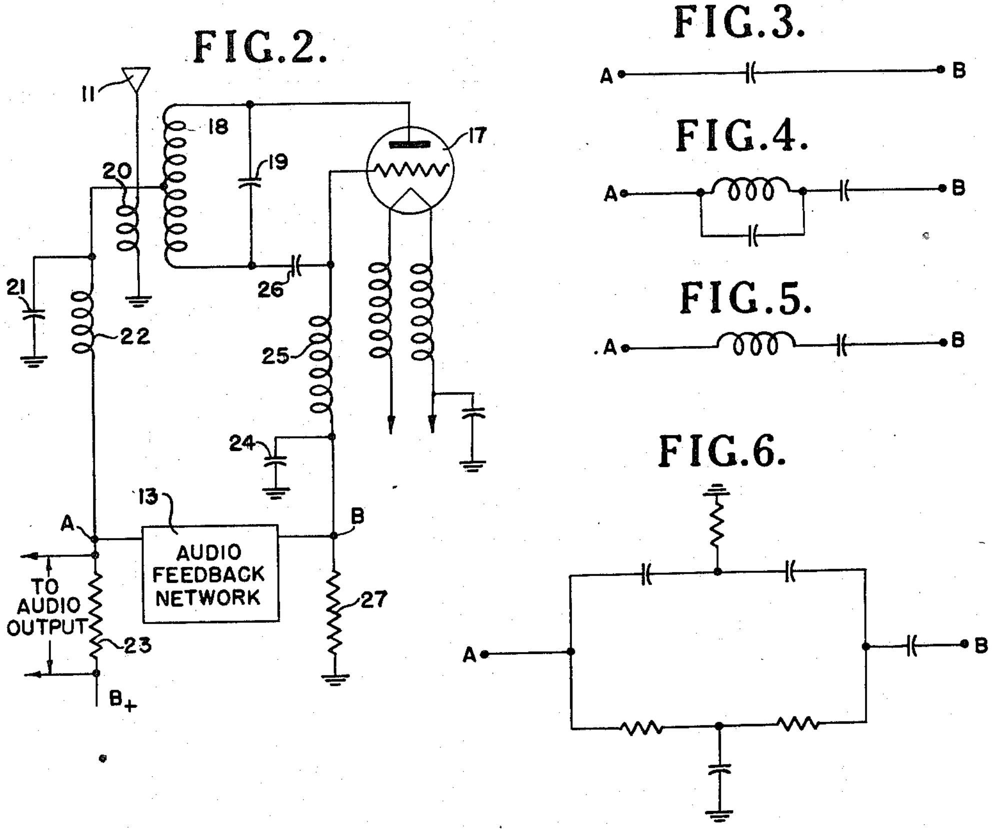
Fig. 2 is a schematic drawing of one form of oscillating detector which may be used in conjunction with the invention showing the audio feedback network in block form.
Fig. 3 illustrates a direct capacitance type audio feedback circuit.
Fig. 4 shows a tuned circuit frequency discriminating type feedback network.
Fig. 5 illustrates a series resonant type feedback network.
Fig. 6 shows a parallel T type frequency selective feedback network.

Referring now to Fig. 2, it can be seen that the oscillating detector 10 includes a triode vacuum tube 17, the plate circuit of which is connected to a tank circuit consisting of an inductance 18 and capacitance 19. As shown, the antenna signals are inductively coupled to the tank circuit through an inductance 20, however, the type of coupling is in no sense critical since the antenna may be capacitively or directly coupled with equally satisfactory results. A portion of the tank circuit voltage containing both the high frequency and the audio frequency signals is taken from a tap on the inductance 18 and passed through a high frequency filter network consisting of a condenser 21, which presents a low impedance to high frequencies, and a high frequency choke 22, which presents a high impedance to the high frequencies. The audio voltage which is passed by the high frequency choke 22 is developed across output resistance 23 to be subsequently fed to the audio amplifier 12 and a portion of these audio signals is returned to the grid of the oscillating detector triode 17 through the audio feedback network 13. A high frequency by-pass condenser 24 and a high frequency choke 25 serve as a filter circuit to prevent the feedback to the grid of any high frequency signal which may have passed through the filter circuit consisting of condenser 21 and choke 22.

Plate voltage for the oscillating detector tube 17 is supplied through the output resistor 23, through the high frequency choke 22 and through the inductance 18 of the tank circuit. A D.C. blocking condenser 26 prevents the application of the D.C. plate voltage to the grid of the tube and a resistor 27 serves as a D.C. return for the grid circuit of the oscillator.

The reflected signals received by the antenna, which differ slightly in frequency from the transmitted signal frequency, are coupled to the plate load tank circuit of the oscillator and cause the impedance presented to the tube to vary at a rate corresponding to this frequency difference. The difference frequency is then separated from the high frequency signals and is returned to the grid of the tube through the feedback network, which is designed according to the type of noise present in the oscillator and the type of output signal desired. For instance, a positive feedback network may be used to increase the gain of the oscillating detector, or by means of a frequency selective positive feedback network, a desired band of low frequency signals may be accentuated. Negative feedback of the type shown in Fig. 3 may be used to return all frequencies above a desired range to the grid circuit to thus eliminate all undesirable high frequency audio signals such as the oscillator microphonic noise output and the like. The audio feedback networks are connected between point A in the plate circuit of the oscillator, which is the junction of resistor 23 and high frequency choke 22, and point B in the grid circuit of the oscillator, which is the junction between resistor 27 and high frequency choke 25.

A negative feedback network of the type shown in Fig. 4 may be connected to present a high impedance to a given band of low frequency signals and to thus feedback all signals outside of this band to eliminate noise frequencies above and below the desired pass band. A negative feedback network such as the one shown in Fig. 5 may be used to present a low impedance and to thus feedback a given band of signals and to present a much higher impedance to frequencies outside of this range, whereby the undesirable signals within the band fed back are attenuated. Another type of frequency discriminating feedback circuit is shown in Fig. 6, which utilizes a conventional parallel T network in series with a blocking condenser for preventing the application of D.C. plate voltage to the grid of the oscillating detector.

Obviously many modifications and variations of the present invention are possible in the light of the above teachings. It is therefore to be understood that within the scope of the appended claim the invention may be practiced otherwise than as specifically described.

What is claimed as new and desired to be secured by Letters Patent is:

An oscillatory-detector stage for a proximity fuze comprising an electron tube having at least a plate and a control grid, a plate load circuit coupled across said plate and control grid, said plate load circuit including a blocking capacitor and a tuned network for determining the high frequency of the oscillatory signal generated by said electron tube, an antenna inductively coupled to said tuned network for varying the effective impedance of said plate load circuit at a low frequency rate corresponding to the frequency difference between the signals radiated by and reflected to said antenna thereby to effect the development of a low frequency signal in said plate load circuit representative of said effective impedance variations, a first high frequency filter network coupled to said tuned network, an impedance coupled to said first filter network across which said low frequency signal is applied, a unidirectional potential energy source coupled to said impedance, a second high frequency filter network coupled to said control grid, said first and second filter networks being adapted to prevent transmission of said oscillatory signal, a resistor coupled to said energy source and to said second filter network, and a frequency discriminating negative feedback circuit coupled between said first and second filter networks for returning a selected frequency portion of said low frequency signal to said control grid.

References Cited in the file of this patent

UNITED STATES PATENTS

| | | |
|---|---|---|
| 2,315,442 | McRae | Mar. 30, 1943 |
| 2,760,188 | Guanella et al. | Aug. 21, 1956 |

FOREIGN PATENTS

| | | |
|---|---|---|
| 585,988 | Great Britain | Mar. 4, 1947 |

OTHER REFERENCES

"Generator-Powered Proximity Fuze," published in Electronics, December 1945.